(12) United States Patent
Dosta

(10) Patent No.: US 11,752,485 B2
(45) Date of Patent: Sep. 12, 2023

(54) PULSED ELECTRIC DISCHARGE DEVICE

(71) Applicant: ADM28 FRANCE, Toulouse (FR)

(72) Inventor: Frédéric Dosta, Lagardelle sur Leze (FR)

(73) Assignee: ADM28 FRANCE, Toulouse (FR)

( * ) Notice: Subject to any disclaimer, the term of this patent is extended or adjusted under 35 U.S.C. 154(b) by 211 days.

(21) Appl. No.: 17/260,198

(22) PCT Filed: Jul. 19, 2019

(86) PCT No.: PCT/EP2019/069462
§ 371 (c)(1),
(2) Date: Jan. 13, 2021

(87) PCT Pub. No.: WO2020/020760
PCT Pub. Date: Jan. 30, 2020

(65) Prior Publication Data
US 2021/0268471 A1  Sep. 2, 2021

(30) Foreign Application Priority Data

Jul. 24, 2018 (FR) .................................. 1856859

(51) Int. Cl.
*B01J 19/08* (2006.01)
*H03K 3/537* (2006.01)
*H05B 1/02* (2006.01)

(52) U.S. Cl.
CPC ............ *B01J 19/088* (2013.01); *H03K 3/537* (2013.01); *H05B 1/0297* (2013.01)

(58) Field of Classification Search
CPC . B01J 19/10; B01J 19/12; B01J 19/088; B01J 2219/0877; B01J 2219/083;
(Continued)

(56) References Cited

U.S. PATENT DOCUMENTS

| | | | | |
|---|---|---|---|---|
| 2,009,218 A | * | 7/1935 | Wiegand | B23D 73/00 137/251.1 |
| 2,900,573 A | * | 8/1959 | Large | B23K 11/248 315/165 |
| 3,258,402 A | * | 6/1966 | Farnsworth | H05H 1/03 376/105 |
| 6,086,684 A | * | 7/2000 | Saito | C23C 8/36 427/580 |

(Continued)

FOREIGN PATENT DOCUMENTS

| | | |
|---|---|---|
| WO | WO 2015/067730 A2 | 5/2015 |
| WO | WO 2017/094003 A1 | 6/2017 |
| WO | WO 2018/001905 A1 | 1/2018 |

OTHER PUBLICATIONS

Search Report from French Intellectual Property Office on corresponding FR application (FR1856859) dated Mar. 15, 2019.

(Continued)

*Primary Examiner* — Xiuyu Tai
(74) *Attorney, Agent, or Firm* — KOS IP LAW LLP

(57) ABSTRACT

The present invention relates to a device for pulsed electric discharge in a liquid, said device comprising at least one pair of electrodes which are configured to be immersed in said liquid and to generate an electric arc in said liquid when a predetermined voltage is applied between said electrodes, at least one heating unit which is configured to heat said liquid for a heating time, at least one discharge unit which is configured to apply a discharge voltage between the electrodes of the at least one pair of electrodes, and at least one control unit which is configured to control the at least one heating unit so that said heating unit heats the liquid for the heating time and to control, at the end of said heating time, the at least one discharge unit so that said at least one discharge unit applies the predetermined voltage between the electrodes of the at least one pair of electrodes and thus generates an electric discharge in the liquid.

15 Claims, 2 Drawing Sheets

(58) Field of Classification Search
CPC ........ B01J 2219/0822; B01J 2219/0896; B01J 2219/0816; B01J 2219/0841; B01J 2219/0813; B01J 2219/0869; B01J 2219/0809; B01J 2219/082; H03K 3/537; H03K 3/64; H03K 3/66; H03K 3/70; H03K 3/72; H05B 3/00; H05B 3/0004; H05B 3/0009; H05B 3/0014; H05B 3/0019; H05B 3/0023; H05B 3/03; H05B 1/0297; B01F 23/2323; B01F 25/53; B01F 23/23123; B01F 23/231265; B01F 33/05; B01F 23/231231; B01D 21/0009; B01D 17/0205; B01D 17/06; C02F 2201/46175; C02F 2201/46135; C02F 1/32; C02F 1/4608; C02F 2103/42; C02F 2201/46125; C02F 2001/46157; C02F 2103/14; C02F 2303/04; C02F 2101/20; C02F 2001/46171; C02F 1/74; C02F 2103/026; C02F 2101/363; F02M 27/04; A61K 9/5192; A61K 33/30; A61K 9/143; A61K 9/14; A61K 33/38; A61J 3/00
See application file for complete search history.

(56) References Cited

U.S. PATENT DOCUMENTS

| | | | |
|---|---|---|---|
| 2002/0014400 A1* | 2/2002 | Zadiraka | B01F 23/2323 422/186.04 |
| 2005/0264217 A1* | 12/2005 | Huston | B60L 53/14 315/77 |
| 2007/0080054 A1* | 4/2007 | Parkansky | H05H 1/48 422/186.04 |
| 2008/0085368 A1* | 4/2008 | Gauthier | B23K 26/0823 427/595 |
| 2015/0064278 A1* | 3/2015 | Pierce | A61K 9/5192 424/618 |
| 2016/0017663 A1* | 1/2016 | Moeny | E21B 17/003 175/327 |

OTHER PUBLICATIONS

International Search Report and Written Opinion on corresponding PCT application (PCT/EP2019/069462) from International Searching Authority (EPO) dated Sep. 20, 2019.

* cited by examiner

PULSED ELECTRIC DISCHARGE DEVICE

TECHNICAL FIELD

The present invention relates to the field of power electronics and more particularly relates to a device and a method for pulsed electric discharge in a liquid. Such a method and device are especially applicable to electro-hydraulic forming, seismic tools, oil well stimulation or lithotripsy.

BACKGROUND

In power electronics, it is known to use a pulsed electric discharge device enabling a very high intensity current to be transferred in a split second under very high voltage between two electrodes immersed in a liquid. The voltage between both electrodes is supplied by an external power supply, for example between 1 and 40 kV, comprising capacitive modules for storing electric energy and restoring it as a very high current under very high voltage.

In a known manner, in the case of a high-voltage pulse discharge in water, there are two phases: a first so-called "pre-discharge" phase followed by a second so-called "breakdown" phase. The pre-discharge phase is triggered by switching on one of the electrodes at a first high voltage value, for example 20 kV, while the other electrode is connected to a ground setting the potential reference, for example 0 kV. During the pre-discharge phase, the voltage defined between both electrodes enables water to be heated to boiling point to create a gas channel for creating the breakdown conditions. During this water temperature rise, the voltage across the electrodes slowly drops to a second voltage value at which the breakdown phase occurs. This breakdown phase corresponds to an electric discharge propagating in the gas channel and creating an electric arc enabling the current to flow between both electrodes.

However, this type of device has several drawbacks, especially in its application to the electro-hydraulic forming of a metal part. First of all, the voltage level at the time of arc creation is not controlled. Energy concentrated between the electrodes, which is then converted into a pressure wave, is therefore not constant from one shot to the next. As a result, the forming pressure applied to the workpiece is not identical from one test to the next. But such differences in forming can be too great, so that some of the parts produced are not compliant. In addition, in the case of forming using several pairs of electrodes, the time frame required to create the arc is in the order of the propagation of the shock wave. But the mean deviation between the breakdown times can prove to be significant, so the synchronization of triggering the different shock waves is not ensured and forming the parts can show inhomogeneities, which represents major drawbacks.

SUMMARY

The purpose of the present invention is to overcome at least partly these drawbacks by providing a simple, reliable and efficient solution of a power amplification device.

For this purpose, one object of the invention is first of all a pulsed electric discharge device in a liquid, preferably water, said device comprising:
at least one pair of electrodes configured to be immersed in said liquid and to generate an electric arc in said liquid when a predetermined voltage is applied between said electrodes,
at least one heating unit configured to heat said liquid for a so-called "heating" duration, and
at least one discharge unit configured to apply a discharge voltage between the electrodes of the at least one pair of electrodes,
at least one control unit configured to control the at least one heating unit so that said heating unit heats the liquid for the heating duration and to control, at the end of said heating duration, the at least one discharge unit so that said at least one discharge unit applies the predetermined voltage between the electrodes of the at least one pair of electrodes and thereby generates an electric discharge in the liquid.

The device according to the invention makes it possible to trigger discharge between the electrodes at a predetermined time instant so that discharges are identically reproducible from one shot to the next. In its application to electro-hydraulic forming, the invention thus makes it possible to ensure reliability and accuracy from one shot to the other in order to achieve uniformity between products. This invention enables the setting of different parameters to optimize discharge efficiency such as, for example, increasing the inter-electrode distance in order to increase the quality of the energy supply or reducing conductivity of the liquid medium in order to make electric arc triggering more stable. The device according to the invention does not require complex outer wiring and can thus be used in an on-board application, for example down-hole for a seismic application.

Preferably, the number of heating unit(s) is equal to the number of discharge unit(s). Alternatively, the device may comprise a number of discharge units greater than the number of heating units.

Further preferably, the device comprises a single control unit connected to all heating and discharge units in order to simplify the architecture of the device.

In one embodiment, each heating unit comprises a capacitive module, connected to one of the electrodes of at least one pair of electrodes, for example comprising one or more capacitors, and a so-called "heating" switch connected on the one hand to said capacitive module and on the other hand to the other electrode of the pair of electrodes.

In one embodiment, each discharge unit comprises a capacitive module, connected to one of the electrodes of at least one pair of electrodes, for example comprising one or more capacitors, and a so-called "discharge" switch connected on the one hand to said capacitive module and on the other hand to the other electrode of the pair of electrodes.

Preferably, the heating duration is predetermined in order to make the discharge trigger fixed from one shot to another and to keep the device simple and efficient.

According to one aspect of the invention, the at least one control unit comprises a counter and is configured to trigger said counter when said at least one control unit activates the at least one heating unit and to activate the at least one discharge unit when said counter has reached the heating duration. Such a counter represents a simple means for measuring the predetermined heating duration.

Advantageously, the heating duration is between 5 and 500 ms in order to enable the discharge to be triggered reliably and efficiently.

Alternatively or additionally, the device, especially the at least one control unit, may be configured to monitor variation in the heating voltage and interrupt heating of the liquid between the electrodes by the at least one heating unit when the heating voltage has reached a predetermined threshold reflecting an energy transfer equivalent to the energy required to reach the boiling temperature between the electrodes and to enable generation of a pulsed electric discharge. The energy required is a function of the volume of water to be heated and depends on the geometry of the electrodes. The energy value can be determined using the following formula:

$$E = \rho \times Cp \times V \times (Te - Ti)$$

where E is the energy required to reach the boiling temperature between the electrodes, ρ is the density of the liquid, Cp is the isobaric heat capacity of the liquid, V is the volume of water to be heated between the electrodes, Te is the boiling temperature of the liquid and Ti is the initial temperature (i.e. before heating) of the liquid.

Alternatively or additionally, the device, especially the at least one control unit, may be configured to monitor variation in the intensity of the current flowing between the electrodes of the at least one pair of electrodes and to interrupt heating of the liquid between said electrodes by the at least one heating unit when the intensity of said current has reached a predetermined threshold reflecting an energy transfer equivalent to the energy necessary to reach the boiling temperature between the electrodes and to enable generation of a pulsed electric discharge, as explained hereinbefore.

According to a feature of the invention, the at least one heating unit is configured to deliver a heating voltage between the electrodes in order to heat the liquid, the use of a voltage applied between the electrodes being a simple and effective means for heating the liquid.

Advantageously, the heating voltage is between 0.1 and 5 kV.

Advantageously, the discharge voltage is between 1 and 40 kV.

According to one aspect of the invention, the device comprises a single pair of electrodes.

In one embodiment of the device, the device comprises a single pair of electrodes, a single heating unit, a single discharge unit and a single control unit.

In another embodiment of the device, the device comprises a single pair of electrodes, a plurality of heating units, a plurality of discharge units and a single control unit. The use of several heating units enables the heating duration to be reduced. The use of multiple discharge units enables power of the current discharge to be increased between the electrodes, especially for forming complex metal parts accurately and efficiently.

In one particular embodiment, the device comprises a pair of electrodes, two heating units, two discharge units and a control unit.

In another particular embodiment, the device comprises a pair of electrodes, three heating units, three discharge units and one control unit.

The invention relates also to a method for generating an electric discharge in a liquid from a pulsed electric discharge device, said method comprising a step of heating said liquid for a heating duration at the end which the liquid has reached a predetermined temperature and, once the heating duration has elapsed, a step of triggering a pulsed electric discharge.

Further characteristics and advantages of the invention will appear in the following description made in relation to the appended figures and given by way of non-limiting examples and in which identical references are given to similar objects.

DETAILED DESCRIPTION

The device according to the invention makes it possible to carry out pulsed electric discharges in a liquid, for example water (forming, oil exploration . . . ) or blood (lithotripsy). The device according to the invention can especially be used to carry out electro-hydraulic forming, to carry out geophysical exploration by generating seismic waves, to improve production of oil wells or to treat kidney stones by lithotripsy.

The device according to the invention comprises at least one pair of electrodes, at least one heating unit, at least one discharge unit and at least one control unit.

Each pair of electrodes is configured to be immersed in a liquid and to generate an electric arc in said liquid when a predetermined voltage is applied between the electrodes of said pair.

Each heating unit is configured to heat the liquid, by supplying a voltage across the electrodes of each pair of electrodes, for a so-called "heating" duration.

Each discharge unit is configured to apply a discharge voltage between the electrodes of at least one pair of electrodes.

Preferably, but without being limited thereto, the device comprises a single control unit. The control unit is configured to simultaneously control the heating unit(s) that heat(s) the liquid for the heating duration. The control unit is also configured to control the discharge unit(s) at the end of said heating duration so that said discharge unit(s) apply the predetermined voltage between the electrodes of the at least one pair of electrodes and thereby generate an electrical discharge in the liquid.

Preferably, when there are several heating units and several discharge units, the at least one control unit is configured to control the heating units synchronously on the one hand and to control the discharge units synchronously on the other hand.

Figure 1:
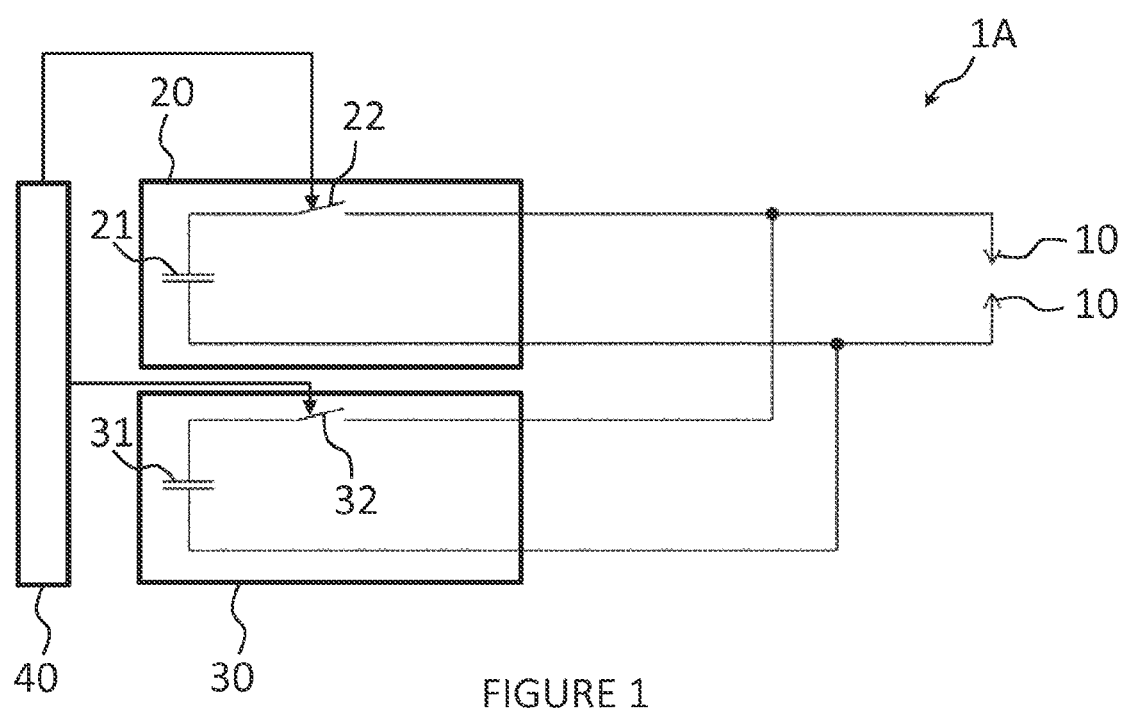
FIG. 1 schematically illustrates a first embodiment of the pulsed electric discharge device according to the invention.
Figure 2:
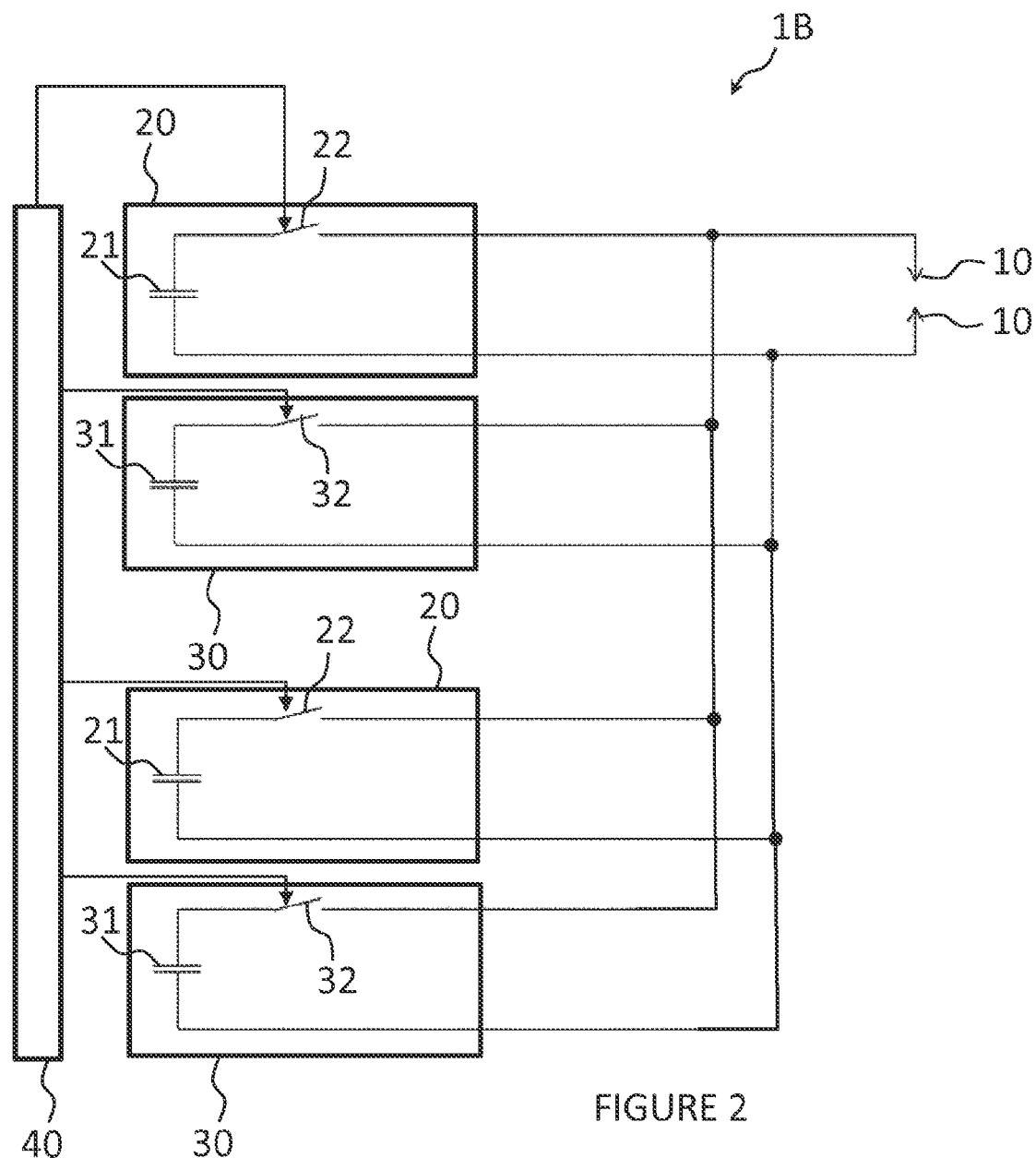
FIG. 2 schematically illustrates a second embodiment of the electric pulse discharge device according to the invention.

A first embodiment of device 1A according to the invention is represented in FIG. 1 and a second embodiment of device 1B according to the invention is represented in FIG. 2. As shown in FIG. 1, device 1A comprises a single pair of electrodes 10, a single heating unit 20, a single discharge unit 30 and a single control unit 40. FIG. 2 shows device 1B comprising a single pair of electrodes 10, two heating units 20, two discharge units 30 and a single control unit 40.

The pair of electrodes 10 is configured to be immersed in the liquid in which one or more pulsed electric discharges are desired to be performed. Specifically, the pair of electrodes 10 is configured to receive a voltage applied between both electrodes 10 of the pair of electrodes 10 in order to generate an electric arc in the liquid when some conditions are met, as explained below.

During a shot, electrical charges propagate from the end of one electrode 10 to the end of the other electrode 10 of the pair in the volume of liquid and gas between them. Electrodes 10 can, for example, be of a generally hollow cylindrical, rotationally symmetrical shape. Preferably, the electrodes 10 are aligned "end to end", i.e. arranged so that their respective longitudinal axes (not represented) coincide and that they have free ends that are spaced apart by a predetermined fixed distance, for example between 1 and 50 mm, preferably between 1 and 25 mm (the increase in the distance between the electrodes 10 making it possible to increase energy deposited between said electrodes 10), and facing each other in the axial direction (direction of the axes of symmetry). During a pulsed electric discharge, the electric arc occurs between these free ends, the facing annular end faces of which are substantially planar (in transverse planes). As illustrated in FIGS. 1 and 2, the opposite axial ends of the electrodes, called connection ends, are each connected on the one hand to at least one heating unit 20 and on the other hand to at least one discharge unit 30.

In each of the embodiments of FIGS. 1 and 2, each heating unit 20 is configured to heat said liquid for a heating duration. This heating duration can be predetermined, for example by being chosen according to the liquid, or adapted in real time, for example by monitoring variation in the voltage across the electrodes 10.

The heating duration ensures that the liquid is hot enough to generate a pulsed electric discharge between both electrodes 10 when a so-called "discharge" voltage is applied by the at least one discharge unit 30. For example, the heating duration can be chosen as the duration required to heat until the volume of liquid between the electrodes vaporizes.

Heating the liquid can be driven by one or more of the following parameters: time, current or voltage in order to determine the heating duration. Similarly, the heating duration can correspond to the duration required to transform the liquid into gaseous phase, for example transformation of liquid water into water vapor. This is because the phase change from liquid to gas changes the resistivity of the medium and thus the current flowing between the electrodes.

In each of the embodiments of FIGS. 1 and 2, the control unit 40, for example a calculator or a microcontroller, can for example monitor current flowing between the electrodes 10 or voltage defined across the electrodes 10 and control the at least one discharge unit 30 when the intensity of said current or said voltage reaches a predetermined threshold, for example 1 kA or 5 kV, for which the temperature of the liquid between the electrodes 10 is sufficient to produce a pulsed electric discharge between said two electrodes 10.

For this purpose, preferably each heating unit 20 comprises a heating generator 21 configured to deliver a so-called "heating" voltage across the electrodes of the pair of electrodes 10 in order to heat the liquid. This heating generator 21 may be in the form of a plurality of capacitors, or a constant current voltage generator. A plurality of capacitors makes it possible to provide a voltage in the order of a few kilovolts in a very short time, for example in the order of 10 ms, while a constant current voltage generator makes it possible to generate a lower voltage, in the order of a few hundred volts, in a longer time, for example in the order of 100 ms. The heating voltage may for example be between 100 V and 5 kV. Each heating unit 20 also comprises a so-called "heating" switch 22 which is controlled by the control unit 40 to open or close.

In each of the embodiments in FIGS. 1 and 2, each discharge unit 30 is configured to apply a discharge voltage across the terminals of pair of electrodes 10. This discharge voltage triggers the generation of a pulsed electric discharge between both electrodes 10. The value of the discharge voltage may, for example, be in the range of 20 kV. In order to generate the discharge voltage, each discharge unit 30 comprises a discharge generator 31, for example in the form of a plurality of capacitors, and a so-called "discharge switch" 32 which is opened or closed by the control unit 40.

It should be noted that the heating generator 21 and the discharge generator 22 may be two distinct physical entities or may be a single entity which is configured to deliver voltages of different values to heat the liquid and to generate a pulsed electric discharge in said liquid, respectively.

The heating unit(s) 20 and the discharge unit(s) 30 are controlled by the control unit 40. More precisely, the control unit 40 is configured to control the heating unit(s) 20 so that said heating unit(s) 20 heat(s) the liquid for the heating duration and to control, at the end of said heating duration, the discharge unit(s) 30 so that said discharge unit(s) 30 apply(ies) the predetermined voltage across the electrodes 10 so as to generate an electric arc in the liquid.

Thus, in other words, the control unit 40 first activates the heating unit(s) 20 until the liquid has reached a temperature sufficient to enable the generation of a pulsating electric discharge, i.e. for the heating duration, and then, once the liquid has been heated, interrupts the operation of the heating unit(s) 20 and triggers, preferably simultaneously, the discharge unit(s) 30 in order to generate a pulsed electric discharge between both electrodes 10.

When the heating duration is predetermined, the control unit 40 may comprise a counter (not represented) which is triggered when the control unit 40 activates the heating unit(s) 20 and when the control unit 40 monitors so as to stop the operation of the heating unit(s) 20 when the counter has reached the heating duration. When the heating duration is not predetermined, the control unit 40 can, once the heating unit(s) 20 has (have) been activated, monitor the variation in the heating voltage and stop the operation of the heating unit(s) 20 when the heating voltage has reached a predetermined threshold, reflecting an energy transfer equivalent to the energy required to reach the boiling temperature between the electrodes and enabling the generation of a pulsed electric discharge as soon as the discharge unit(s) 30 has (have) reached the discharge voltage between the electrodes 10.

In the second embodiment illustrated in FIG. 2, both heating units 20 are connected in parallel and connected to the control unit 40 on the one hand and to the pair of electrodes 10 on the other hand. Similarly, both discharge units 30 are connected in parallel and are connected to the control unit 40 on the one hand and to the pair of electrodes 10 on the other hand. Each heating unit 20 comprises a heating generator 21 and a heating switch 22. Each discharge unit 30 comprises a discharge generator 31 and a discharge switch 32.

By connecting the heating units 20 in parallel with each other, the liquid can be heated more quickly. By connecting the discharge units 30 in parallel with each other, power supplied to the pair of electrodes 10 can be easily and variably increased, while ensuring that power is supplied between the electrodes 10 at the same time, the discharge units 30 being thus synchronized with each other.

It will be noted that it is possible to easily connect more than two heating units 20 and also more than two discharge units 30 in parallel, for example by adding them respectively to one or more heating units 20 and one or more discharge units 30 of an existing device, in order to further increase power if necessary. Preferably, the same number of heating units and discharge units is used, without limiting the scope of the present invention.

Such a device 1B is particularly effective in an application to hydraulic forming for which power required for forming is very high and requires arranging several discharge units 30 in parallel.

Figure 3:
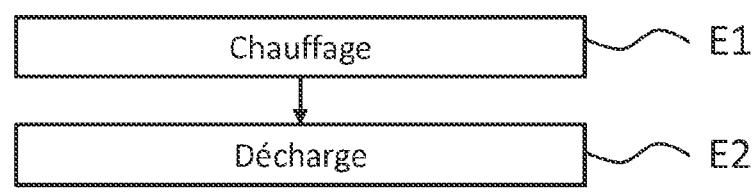
FIG. 3 schematically illustrates an embodiment of the method according to the invention.

The invention will now be described in its implementation with reference to FIG. 3 for the first embodiment and the second embodiment of device 1A, 1B when said device 1A, 1B is immersed in a liquid.

First, when a pulsed electric discharge is to be performed, the control unit 40 will control the heating unit(s) 20 so that said heating unit(s) 20 heats the liquid between the electrodes 10 in a step E1.

For this purpose, the control unit 40 closes the heating switch 22 of the heating unit(s) 20 so that the heating generator 21 delivers the heating voltage to the pair of electrodes 10 for the heating duration.

When the heating duration is predetermined, the control unit 40 triggers the counter at the same time as it closes the heating switch(s) 22 of the heating unit(s) 21 and then opens the heating switch 22 once the heating duration has elapsed. When the heating duration is not known in advance, the control unit 40 monitors voltage across the respective pair of electrodes 10 in order to activate the discharge unit(s) 30 when the observed voltage has reached a predetermined voltage threshold characterizing an energy accumulation in the liquid between the electrodes 10 sufficient to enable discharge. The control unit 40 may also monitor voltage, for example between 100 V and 5 kV, and current, for example between 10 A and 1 kA, in order to calculate energy, for example between a few hundred Joules and in the order of 10 kJ, actually deposited in the liquid and to activate the discharge unit(s) 30 when the required energy is reached.

Once the heating duration has elapsed (i.e. the predetermined duration has elapsed or the predetermined voltage threshold has been reached), the control unit 40 activates the discharge unit(s) 30 so that said discharge unit(s) 30 triggers a pulsed electric discharge between the electrodes 10 in a step E2.

For this purpose, simultaneously with the opening of the heating switch(es) 22 of the heating unit(s) 20 or immediately thereafter, for example between 5 and 500 ms after said opening (bearing in mind that it may be necessary to wait several seconds, for example, to recharge the capacitors), the control unit 40 closes the discharge switch(es) 32 of the discharge unit(s) 30 so that the discharge generator(s) 31 of the discharge unit(s) 30 apply the discharge voltage, for example in the order of 20 kV, between the electrodes 10 in order to generate a pulsed electric discharge between both electrodes 10 of the pair of electrodes 10.

Waves generated by this discharge are then used for the intended application, for example to form a part, which can be of metal or plastic material.

The invention therefore advantageously ensures that the liquid is precisely heated in order to trigger a pulsed electric discharge at a predictable time instant, thus making the method repeatable and identically reproducible. In particular, in a device 1B with several discharge units, the invention makes it possible to trigger in a single instant a single high power pulsed electric discharge in such a way, unlike a device with several pairs of electrodes of the prior art which requires a synchronization that can prove complex and inaccurate.

It should be noted that the present invention is not limited to the examples described above and is susceptible to numerous alternatives accessible to the skilled person.

The invention claimed is:

1. A pulsed electric discharge device in a liquid, said device comprising:
   at least one pair of electrodes configured to be immersed in said liquid and to generate an electric arc in said liquid when a predetermined voltage is applied between said at least one pair of electrodes;
   at least one heating unit configured to heat said liquid for a heating duration;
   at least one discharge unit configured to apply a discharge voltage between the at least one pair of electrodes; and
   at least one control unit configured to control the at least one heating unit so that said at least one heating unit heats the liquid for the heating duration and to control, at an end of said heating duration, the at least one discharge unit so that said at least one discharge unit applies the predetermined voltage between the at least one pair of electrodes to generate an electrical discharge in the liquid.

2. The device according to claim 1, wherein the heating duration is predetermined.

3. The device according to claim 1, wherein the at least one control unit comprises a counter that is configured to trigger when said at least one control unit activates the at least one heating unit and said at least one control unit is configured to activate the at least one discharge unit when said counter has reached the heating duration.

4. The device according to claim 1, wherein the heating duration is between 5 ms and 500 ms.

5. The device according to claim 1, wherein the at least one heating unit is configured to deliver a heating voltage between the at least one pair of electrodes in order to heat the liquid.

6. The device according to claim 5, wherein the heating voltage is between 0.1 kV and 5 kV.

7. The device according to claim 1, wherein the discharge voltage is between 1 kV and 40 kV.

8. The device according to claim 1, wherein the at least one pair of electrodes comprises a single pair of electrodes, the at least one heating unit comprises a single heating unit, the at least one discharge unit comprises a single discharge unit, and the at least one control unit comprises a single control unit.

9. The device according to claim 1, wherein the at least one pair of electrodes comprises a single pair of electrodes, the at least one heating unit comprises a plurality of heating units, the at least one discharge unit comprises a plurality of discharge units, and the at least one control unit comprises a single control unit.

10. A method for generating an electric discharge in a liquid from the pulsed electric discharge device according to claim 1, said method comprising a step of heating said liquid for the heating duration at the end of which the liquid has reached a predetermined temperature and, once the heating duration has elapsed, a step of triggering a pulsed electric discharge.

11. A pulsed electric discharge device in a liquid, said device comprising:
   a pair of electrodes configured to be immersed in said liquid and to generate an electric arc in said liquid when a predetermined voltage is applied between said pair of electrodes;
   a heating unit configured to heat said liquid for a heating duration, the heating unit comprising a plurality of capacitors or a constant current voltage generator;
   a discharge unit configured to apply a discharge voltage between the pair of electrodes; and
   a control unit configured to control the heating unit so that said heating unit heats the liquid for the heating duration and to control, at an end of said heating duration, the discharge unit so that said discharge unit applies the predetermined voltage between the pair of electrodes to generate an electrical discharge in the liquid.

12. The device according to claim 11, wherein the heating duration is between 5 ms and 500 ms.

13. The device according to claim 11, wherein the control unit comprises a counter that is configured to trigger when the control unit activates the heating unit and said control unit is configured to activate the discharge unit when said counter has reached the heating duration.

14. The device according to claim 11, wherein the heating unit is configured to deliver a heating voltage of between 1 kV and 40 kV between the pair of electrodes in order to heat the liquid.

15. The device according to claim 11, wherein the heating unit is a first heating unit and further comprising a second heating unit, the discharge unit is a first discharge unit and further comprising a second discharge unit.

* * * * *